(12) United States Patent
Singh et al.

(10) Patent No.: US 8,237,422 B2
(45) Date of Patent: Aug. 7, 2012

(54) EFFICIENT SWITCH CASCODE ARCHITECTURE FOR SWITCHING DEVICES

(75) Inventors: Saumitra Singh, Bangalore (IN);
Rupak Ghayal, Bangalore (IN);
Chakravarthy Srinivasan, Bangalore (IN); Prakash Easwaran, Bangalore (IN)

(73) Assignee: Cosmic Circuits Private Limited, Bangalore (IN)

( * ) Notice: Subject to any disclaimer, the term of this patent is extended or adjusted under 35 U.S.C. 154(b) by 534 days.

(21) Appl. No.: 12/463,385

(22) Filed: May 9, 2009

(65) Prior Publication Data

US 2010/0283439 A1  Nov. 11, 2010

(51) Int. Cl.
*G05F 1/10* (2006.01)

(52) U.S. Cl. ........................................................ 323/282

(58) Field of Classification Search .................. 323/282; 327/108
See application file for complete search history.

(56) References Cited

U.S. PATENT DOCUMENTS

| 6,566,846 | B1 | 5/2003 | Voo |
| 7,649,384 | B2 * | 1/2010 | Ho et al. .......................... 326/83 |

* cited by examiner

*Primary Examiner* — Adolf Berhane
*Assistant Examiner* — Yemane Mehari
(74) *Attorney, Agent, or Firm* — Evergreen Valley Law Group, P.C.; Kanika Radhakrishnan (57) ABSTRACT

Efficient switch cascode architecture for switching devices, such as switching regulators. The cascode architecture includes a switching stage responsive to an external driver signal for switching transitions, and a bias generator operative to bias the cascode transistor of the switching stage to protect the switching stage from damage during the switching transitions.

21 Claims, 8 Drawing Sheets

EFFICIENT SWITCH CASCODE ARCHITECTURE FOR SWITCHING DEVICES

This patent application claims priority from Indian Non provisional patent application number 899/CHE/2008, filed on Apr. 10, 2008 entitled "AN EFFICIENT SWITCH CASCODE ARCHITECTURE FOR SWITCHING DEVICES" and assigned to Cosmic Circuits Private Limited., 303, A Block, AECS Layout, Kundalahalli, Bangalore-560037, India, which is hereby incorporated in its entirety.

FIELD

Embodiments of the invention relate generally to switching devices and more particularly to switch cascode architectures in switching devices such as switching regulators.

BACKGROUND

Many of today's battery powered consumer products require more than one power supply voltage levels to operate. For example, a Central Processing Unit (CPU) for a laptop may be designed to operate at 2.9 volts while the hard disk drive operates at 5 volts. Instead of providing several sources of power supply, these products typically use a single power supply source and generate other supply levels with DC to DC converters. The DC to DC conversion is typically performed by the power supply regulator circuitry that is universally provided in battery operated electronic products.

There are basically two types of power supply regulators, linear and switching regulators. Linear regulators rely on a linear control element with a feedback to regulate a constant voltage. When a linear regulator is used as a DC to DC converter, there is an appreciable amount of power dissipation.

In a switching regulator, a transistor operating as a switch (switch transistor) periodically applies the input voltage across an inductor for short intervals. Since the input voltage is switched ON and OFF to transfer just enough charge to the load, an ideal switching regulator dissipates zero power. There are several types of switching regulators, for example, step-down, step-up, and inverting regulators. Although there are different ways to realize switching conversion, a common method uses inductor and capacitor as energy storage elements and a Metal Oxide Semiconductor Field Effect Transistor (MOSFET) as the switch transistor.

MOSFETs have limit on voltage stress across terminals for reliable operation. For a switching regulator implemented in a given technology, if the input voltage supplied to the switch transistors (MOSFETs) of a switching stage is higher than the limit on voltage stress, MOSFETs of the switching stage may face reliability issues. A known method to rectify these reliability issues in switching stages is to cascode a set of MOSFETs. In a cascoded structure of MOSFETs, when an input voltage which is higher than the limit on voltage stress is supplied to a set of MOSFETs, the input voltage will be shared among the set of MOSFETs. One problem which arises in such a cascode structure is to ensure that the input voltage is equally shared among the MOSFETs. Another problem is to divide the stress equally even in the presence of glitches at the nodes caused by switching transients.

Figure 1:
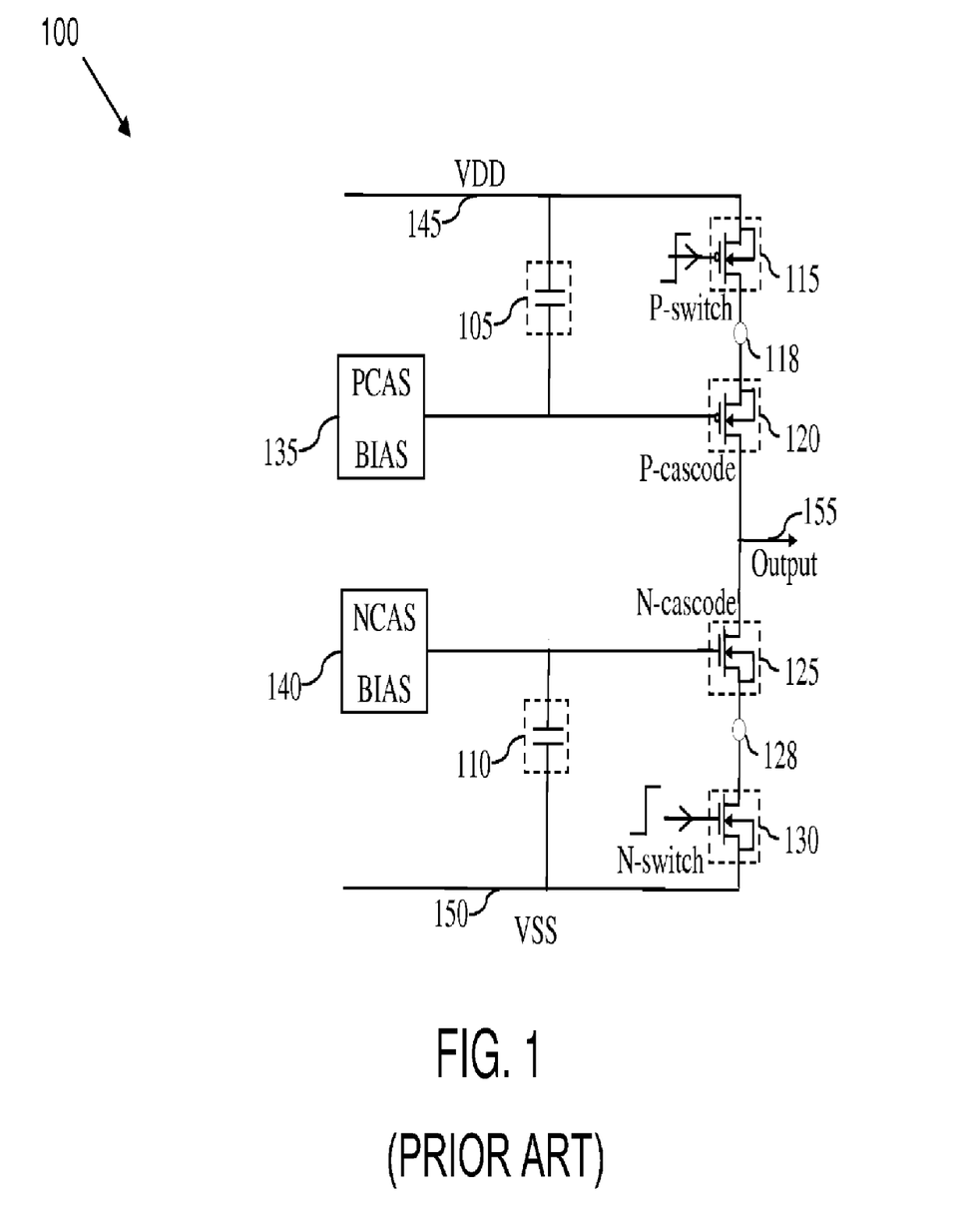
FIG. 1 illustrates a simplified circuit diagram of a capacitor held cascode structure of a switching regulator according to the prior art.

FIG. 1 illustrates a simplified circuit diagram of a capacitor held cascode structure 100 of a switching regulator according to the prior art. The capacitor held cascode structure 100 includes a series connected structure of a P-type switch transistor (PMOS) 115, a P-type cascode transistor (PMOS) 120, an N-type cascode transistor (NMOS) 125 and an N-type switch transistor (NMOS) 130. A bias voltage (PCAS BIAS) 135 is supplied to the P-type cascode transistor 120 and another bias voltage (NCAS BIAS) 140 is supplied to the N-type cascode transistor 125. A capacitor 105 is connected in parallel with the series combination of the P-type switch transistor 115 and P-type cascode transistor 120. Similarly, a capacitor 110 is connected in parallel with the series combination of the N-type switch transistor 125 and N-type cascode transistor 130. The values of capacitors 105 and 110 are selected to be larger than any parasitic capacitance of the switching transistors, as explained in more detail in the next paragraph.

Further explaining the need of capacitors with large capacitance value, a parasitic capacitance exists between all the terminals of the MOSFETs (drain to gate, source to gate and drain to source). Because of this parasitic capacitance between drain and gate, a rapid change in output potential during a switching transition can result in a corresponding rapid change in the potential on a node 118 between the P-type switching transistor 115 and P-type cascode transistor 120. This rapid potential change can exceed the maximum safe potential difference across the terminals of the transistor and can therefore result in premature failure of the transistor. A known method for rectifying these reliability issues is to specify values for capacitor 105 that are significantly higher than the values of the parasitic capacitance of the switching transistors. In on-chip switch implementations, capacitors of such large capacitance value occupy a large die area. Further, while increasing the values of the capacitor 105 holds the gate of the P-type cascode transistor 120 at a constant value with respect to the input voltage, it does not maintain all the transistors in reliable region of operation when the output transitions from low voltage to high voltage when there will be glitches in the input voltage node 145, the output node 155 and ground voltage node 150 due to L*di/dt, wherein L is the bond wire inductance and di/dt is the rate of change of current. In such case, stress occurs at the P-type cascode transistor 120. Similar reliability issues can occur on N-type switch transistor 125 and N-type cascode transistor 130.

In light of the foregoing discussion, there is a need to provide a reliable and area efficient switch cascode structure in cascode implementations.

SUMMARY

Embodiments of the invention described herein provide systems and methods for providing a switch cascode architecture for high voltage switching devices where transistor ratings of the switching stages are lower than switching voltages.

An exemplary embodiment of the invention provides a switch cascode architecture for high voltage switching regulators. The switching regulator includes a switching stage responsive to an external driver signal for switching transitions, and a bias generator operative to bias the cascode transistor of the switching stage to protect the switching stage from damage during the switching transitions. The drive strength of the bias generator is controlled in response to a first control signal of the switching stage.

An exemplary embodiment of the invention provides a drive circuit for controlling drive strength of a bias generator connected to an output switching circuit. The drive circuit includes a first circuit for controlling the drive strength of the bias generator in response to a control signal supplied to the bias generator. The control signal is supplied to the bias generator according to an output timing control signal of a switching stage of the output switching circuit. The drive circuit further includes a second circuit for supplying a DC bias voltage to an output switching circuit in response to a bias voltage supplied to the second circuit according to a predetermined criterion after supplying the control signal.

An exemplary embodiment of the invention provides a method for implementing switch cascode architecture for high voltage switching regulators. Drive strength of a bias generator is controlled in response to switching transitions of the switching stage, and the bias generator is used to bias a cascode element of the switching stage during switching transitions to protect the switching stage from damage.

Other aspects and example embodiments are provided in the Figures and the Detailed Description that follows.

DETAILED DESCRIPTION OF THE EMBODIMENTS

Embodiments of the invention described herein provide systems and methods for providing switch cascode architecture for high voltage switching devices, for example switching regulators operating in low voltage technologies. Embodiments of the invention have been explained using switching regulators as an example. However, it will be appreciated that embodiments of the invention are applicable to switching stages in any switching devices where transistor ratings of the switching stages are lower than switching voltages. Examples of such switching stages include IO buffers and charge pump switching stages.

Figure 2:
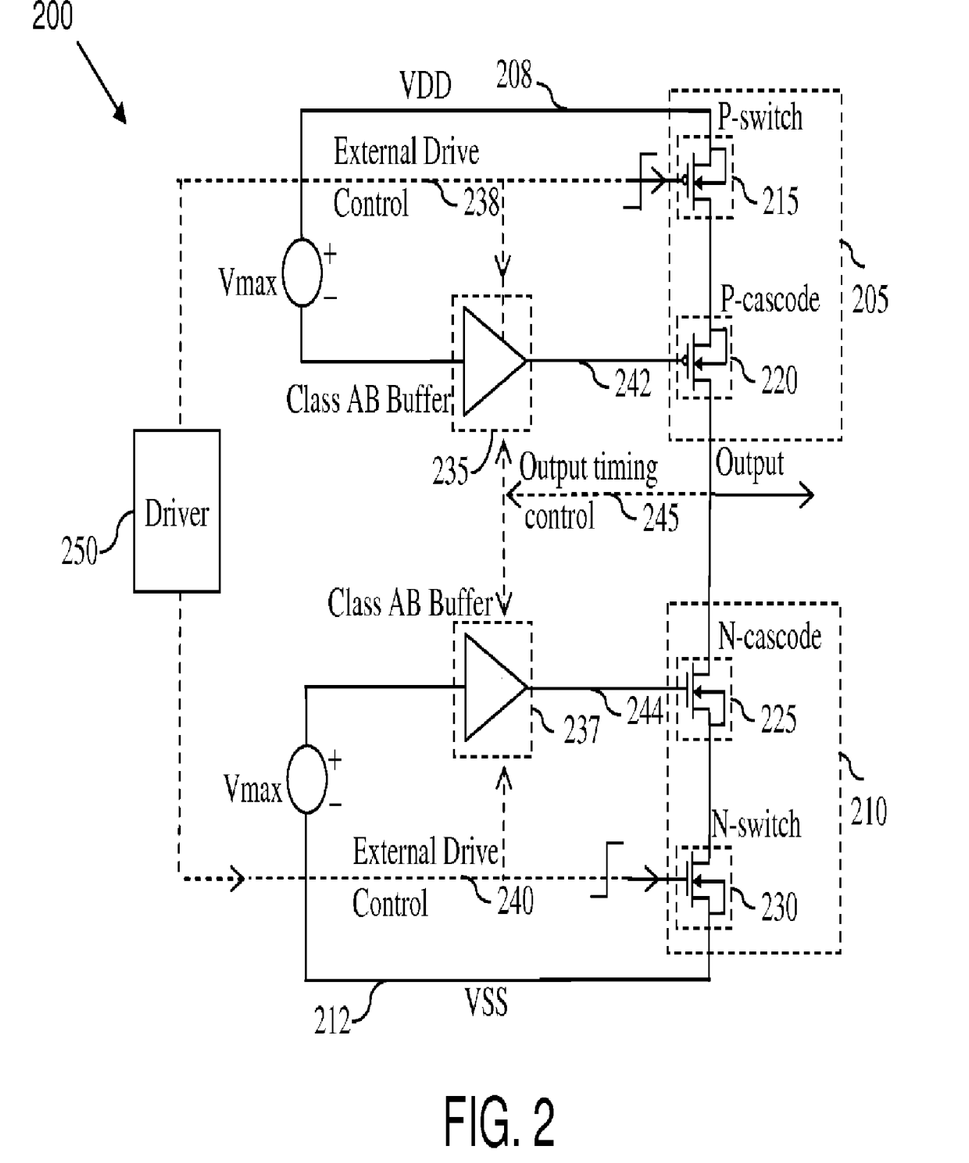
FIG. 2 is a circuit diagram illustrating an exemplary implementation of a switch cascode architecture of a switching stage according an embodiment of the invention.

FIG. 2 is a circuit diagram illustrating an exemplary implementation of a switch cascode architecture 200 of a switching stage according an embodiment of the invention. The switching stage includes a first cascode transistor stack 205 serially connected to a second cascode transistor stack 210. Each of the cascode transistor stacks 205, 210 includes a switch transistor 215, 230 and a cascode transistor 220, 225 serially connected to each other. A source of the switch transistor 215 of the first cascode transistor stack 205 is connected to the voltage supply line VDD 208, a gate is connected to the driver and a drain is connected to the source of the cascode transistor 220. A gate of the cascode transistor 220 is connected to the bias generator 235 and a drain is connected to a drain of the cascode transistor 225 of the second cascode stack 225. A source of the switch transistor 230 of the second cascode transistor stack 210 is connected to the return supply line VSS 212 and a gate is connected to the driver 250. A gate of the cascode transistor 225 is connected to the bias generator 237. In an embodiment of the invention, first transistor stack 205 includes a P-type switch transistor (PMOS) 215 and P-type cascode transistor (PMOS) 220 and second transistor stack 210 includes an N-type switch transistor (NMOS) 230 and N-type cascode transistor (NMOS) 225.

Gates of the switch transistors 215, 230 are connected to a driver 250 for driving the switch transistors 215, 230 through the external driver signal lines 238 and 240. Gates of the cascode transistors 220, 225 are driven by a set of bias generators 235 and 237 through lines 242 and 244. In an embodiment of the invention, the bias generator includes a buffer 235 or 237. In an embodiment of the invention, the set of buffers (235 and 237) includes a class AB buffer.

In an embodiment of the invention, switching transitions of the switching stage is controlled by controlling the drive strength of the set of buffers (235 and 237) in response to a first set of control signals. The first set of control signals includes an output timing control signal 245 from the output of the switching stage and an external driver signal (238 or 240) from the driver 250. Output timing control signal 245 includes toggling information of switch transistors 215, 230.

Operation of the switch cascode architecture 200 according to an embodiment of the invention is explained as follows. The output of the switching stage toggles to the voltages supplied by the supply lines VDD 208 or VSS 212 according to the external driver signals from the driver 250 which is connected to the P-type switch transistor 215 and N-type switch transistor 230. Driver 250 supplies the signal which either turns P-type switch transistor 215 or N-type switch transistor ON 230.

When P-type switch transistor 215 is ON, output of the switching stage is transitioning to high which is coupled (through a coupling capacitor existing between the gate and drain of the P-type switch transistor 215) to the gate of the P-type cascode transistor 220. To control this transition, a class AB buffer 235 with sinking feature is used to drive the P-type cascode transistor 220. When the output of the switching stage transitions to high, class AB buffer 235 prevents the gate of the P-type cascode transistor from increasing beyond a certain limit. However, some movement is allowed on the gate of the P-type cascode transistor 220 to keep both P-type switch transistor 215 and P-type cascode transistor 220 in the reliable range of operation. This movement is controlled by controlling the drive strength of the class AB buffer 235 for the given size of the P-type switch transistor 215 and P-type cascode transistor 220, and also the appropriate output timing control signal 245 of the class AB buffer 235 from the output of switching stage and the external drive control signal 238 of the P-type switch transistor 215. Once the transition is over, class AB buffer 235 supplies a predetermined DC bias voltage to the P-type cascode transistor 220 which holds the output value of the switching stage according to the value of the predetermined DC bias voltage.

When P-type switch transistor 215 is OFF, output of the switching stage is transitioning to low which is coupled (through a coupling capacitor existing between the gate and drain of the P-type switch transistor 215) to the gate of the P-type cascode transistor 220. To control this transition, a class AB buffer 235 with sourcing feature is used to drive the P-type cascode transistor 220. When the output of the switching stage transitions to low, class AB buffer 235 prevents the gate of the P-type cascode transistor from decreasing beyond a certain limit. However, some movement is allowed on the gate of the P-type cascode transistor 220 to keep both P-type switch transistor 215 and P-type cascode transistor 220 in the reliable range of operation. This movement is controlled by controlling the drive strength of the class AB buffer 235 for the given size of the P-type switch transistor 215 and P-type cascode transistor 220, and also the appropriate output timing control signal 245 of the class AB buffer 235 from the output of switching stage and the external drive control signal 238 of the P-type switch transistor 215. After sourcing the current, class AB buffer 235 supplies a predetermined DC bias voltage to the P-type cascode transistor 220 which holds the output value of the switching stage according to the value of the buffered DC bias voltage. A similar sourcing and sinking mechanism is performed for N-type cascode transistor 225 depending on the transitions using class AB buffer 237. Sinking and sourcing mechanism is explained in detail in conjunction with FIG. 4.

In an embodiment of the invention, the drive strength of class AB buffer may be controlled using the output timing control signal 245 or the external driver signal 238 or 240. In another embodiment of the invention, the drive strength of class AB buffer (235 or 237) may be controlled using a combination of the output timing control signal 245 and the external driver signal 238 or 240.

It will be appreciated that FIG. 2 is only an exemplary implementation and, in some implementations, switch transistors and cascode transistors can be implemented using transistors of any conduction type. Also, there can be several transistor stacks serially connected to each other in the switching stage which are connected to several class AB buffers.

Figure 3:
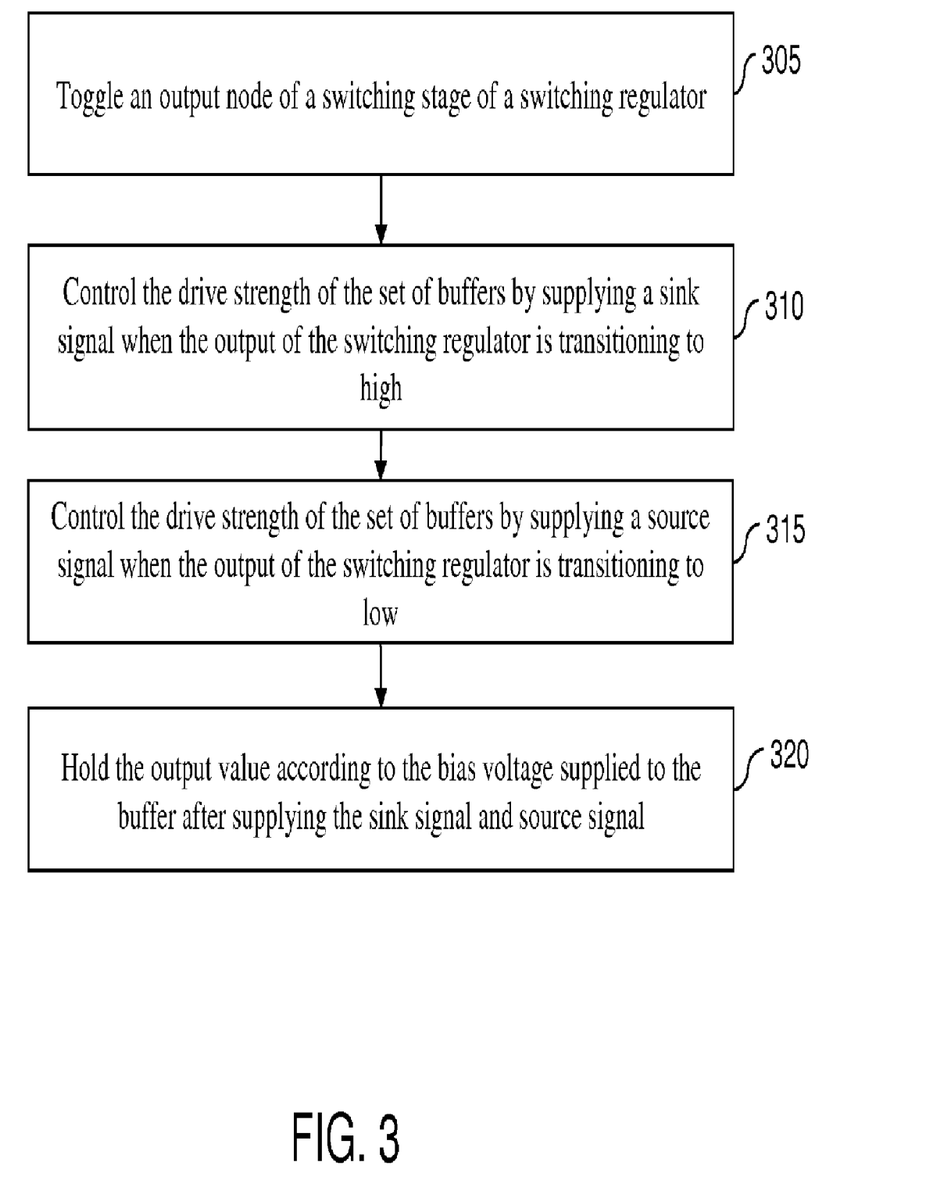
FIG. 3 is a flow diagram illustrating a method for implementing switch cascode architecture of a switching stage according an embodiment of the invention.

FIG. 3 is a flow diagram illustrating a method 300 for implementing switch cascode architecture of a switching stage according an embodiment of the invention. In general, drive strength of a bias generator is controlled in response to switching transitions of the switching stage. In an embodiment of the invention, the bias generator includes a class AB buffer 235 and 237. Further, the bias generator (235 or 237) is used to bias a cascode element of the switching stage. At step 305, an output node of a switching stage of a switching regulator is toggled using a driver 250. The driver 250 sends an external driver signal 238 or 240 which activates the switch transistors (P-type switch transistor 215 and N-type switch transistor 230) of the switching stage. Output of switching stage is controlled by controlling the drive strength of a set of buffers 235 connected to the switching stage. Set of buffers 235 and 237 are activated using a set of control signals from the switching stage. The set of control signals include an output timing control signal 245 and an external driver signal 238 or 240. The set of buffers 235 is made to control the gate of the cascode transistor of the switching stage by sourcing or sinking the current from the gate of cascode transistor during output transitions. At step 310, a sink signal is supplied to the buffer (235 or 237) for enabling the current sinking capability according to the output timing control signal 245 when the output of the switching regulator is transitioning to high. At step 315, a source signal is supplied to the buffer (235 or 237) for enabling the current sourcing capability according to the output timing control signal 245 when the output of the switching regulator is transitioning to low. After supplying either source or sink signals according to the switching transitions, at step 320, output of the switching stage is held at a value according to a predetermined DC bias voltage supplied to the buffer (235 or 237).

In an embodiment of the invention, power consumption of the set of buffers (235 and 237) is advantageously reduced by supplying a high current sink signal and source signal to the switching stage of the switching regulator prior to activating the switch transistors, and by supplying a low current sink signal and source signal when the switch transistors are inactive. A high current source signal indicates P-type transistor is OFF and low current source signal indicates P-type transistor is ON. A high current sink signal indicates N-type transistor is ON and low current sink signal indicates N-type transistor is OFF.

The method embodiment of FIG. 3 is explained considering a buck type switching regulator as an example. However, the method embodiment of FIG. 3 can also be extended to non-buck type regulator where an active device is used to control the cascode gates of the switching stage.

Figure 4:
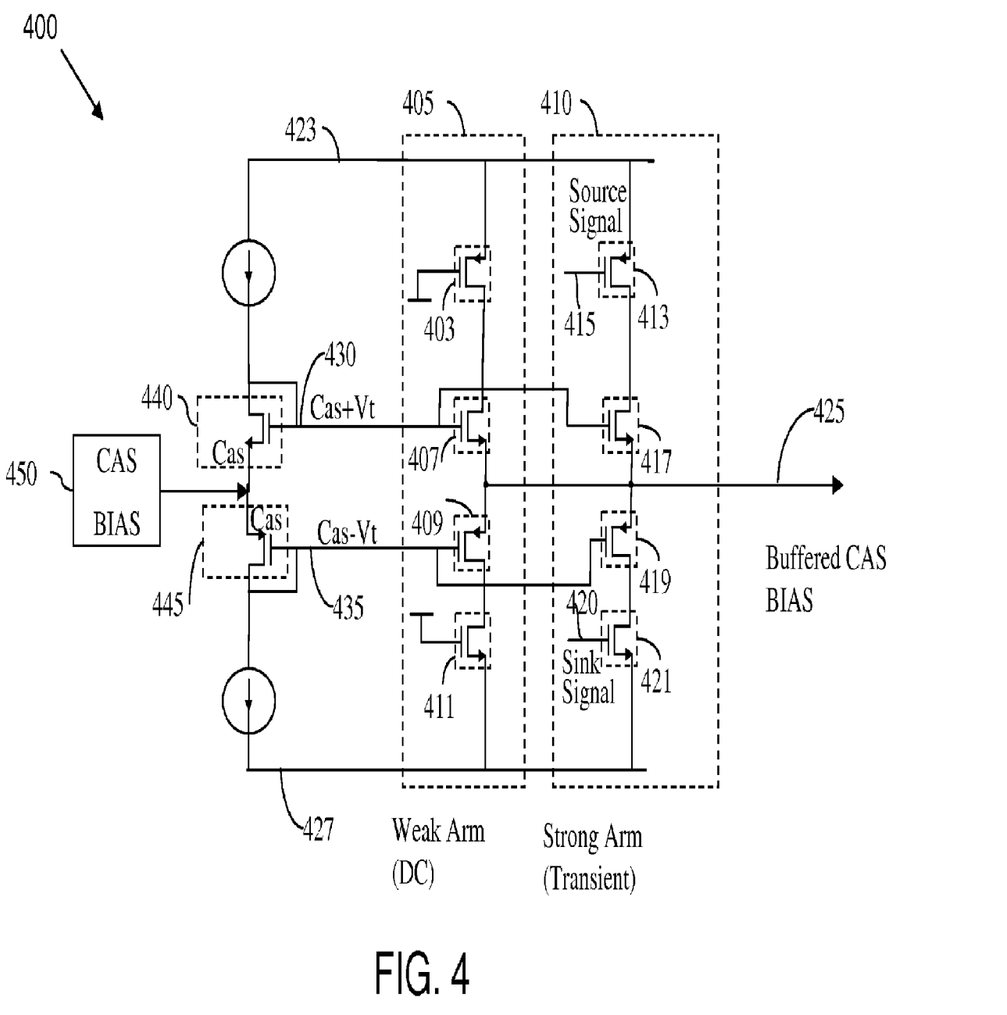
FIG. 4 is a circuit diagram illustrating an exemplary implementation of a buffer according to an embodiment of the invention.

FIG. 4 is a circuit diagram illustrating an exemplary implementation of a buffer 400 according to an embodiment of the invention. In an embodiment of the invention, the buffer 400 includes a class AB buffer. The class AB buffer 400 includes a first transistor stack 405 ("weak arm" as shown in FIG. 4) has a first transistor 403 with a source connected to a voltage supply line 423 and a drain connected to a drain of a second transistor 407. A source of the second transistor 407 is connected to a source of a third transistor 409 and a drain of the third transistor 409 is connected to a drain of a fourth transistor 411. A 'buffered CAS BIAS' output line 425 is connected to the sources of the transistors 407 and 409. A source of the fourth transistor 411 is connected to the common return supply line 427. A gate of the transistor 407 is connected to a gate of the transistor 440 to receive a predetermined bias voltage 'Cas+Vt' on line 430. Similarly a gate of the transistor 409 is connected to a gate of the transistor 445 to receive a predetermined bias voltage 'Cas−Vt' on line 435. The predetermined bias voltage supplied to the gates of the transistors 407 and 409 provide a DC bias voltage to the switching stage of the switching regulator.

Class AB buffer 400 also includes a second transistor stack 410 ('strong arm as shown' in FIG. 4) which is controlled using source signal 415 and sink signal 420 to supply a buffered cascode bias voltage 425 to the switching stage. Buffered cascode bias voltage 425 drives the gates of the switching stage cascode transistors to control the movement of the gate during the switching transitions. The second transistor arm 410 has a fifth transistor 413 with a source connected to a voltage supply line 423 and a drain connected to a drain of a sixth transistor 417. A source of the sixth transistor 417 is connected to a source of a seventh transistor 419 and a drain of the seventh transistor 419 is connected to a drain of an eighth transistor 421. A 'buffered CAS BIAS' output line 425 is connected to the sources of the transistors 417 and 419. A source of the eighth transistor 421 is connected to the common return supply line 427. A gate of the fifth transistor 413 receives a source signal on line 415. Similarly a gate of the eighth transistor 421 receives a sink signal on line 420.

Operation of the class AB buffer 400 according to the embodiment of the invention is explained as follows. The fifth transistor 413 is turned ON when the source signal 415 is low and the eighth transistor 421 is turned on when the sink signal 420 is high. Sink and source signals are used to control the drive strength of the class AB buffer 400. If sink signal 420 is supplied to the eighth transistor 421, output of the class AB buffer 400 is enabled to sink current. Now if gate of the cascode transistor (220 or 225) moves high, class AB buffer 400 is capable of pulling it down and holding to a value of CAS BIAS 450. And when source signal 415 is supplied to the fifth transistor 413, output of the class AB buffer 400 is enabled to source current. Now if the gate of the cascode transistor (220 or 225) moves low class AB buffer 400 is capable of pulling it high and holding to a value of CAS BIAS 450. This controlled sinking and sourcing features are used to control the gate of the cascode transistor (220 or 225) of switching stage of the switching regulator.

Voltage levels of sinking and sourcing features of class AB buffer 400 is controlled by the transistors 440 and 445. After supplying the sink or source signals, the output of the switching stage is held at a voltage equal to predetermined bias voltage determined by the transistors 440 and 445 and the CAS BIAS voltage from 450. A cascode bias voltage 450 is supplied to the transistors 440 and 445. Further, transistors 440 and 445 supply bias voltages 'Cas+Vt' and 'Cas−Vt' to the weak arm 405 of class AB buffer 400 where 'Cas' is the cascode bias supplied by the cascode bias voltage 450 and 'Vt' is the threshold voltage to the transistors 440 and 445. Bias voltages Cas−Vt and 'Cas+Vt' are voltages which define the limit up to which the output of the switching stage is 'pulled up' or 'pulled down'. For example, the output voltage of the switching stage does not decrease than the bias voltage 'Cas−Vt' and does not increase than the bias voltage 'Cas+Vt'.

In the exemplary implementation shown in FIG. 4, the first, third, fifth and seventh transistors (403, 409, 413 and 419) include P-type transistors and the second, fourth, sixth and eighth transistors (407, 409, 417 and 421) include N-type transistors. However, it will be appreciated that in an embodiment of the invention, the transistors can be implemented using transistors of any conduction type. Further, for the sake of simplicity, the transistor pairs are shown as first transistor stack 405 and second transistor stack 410 in an embodiment of the invention. In an embodiment of the invention, a single transistor stack can supply DC bias voltage as well as transient voltage to the switching regulator.

Figure 5:
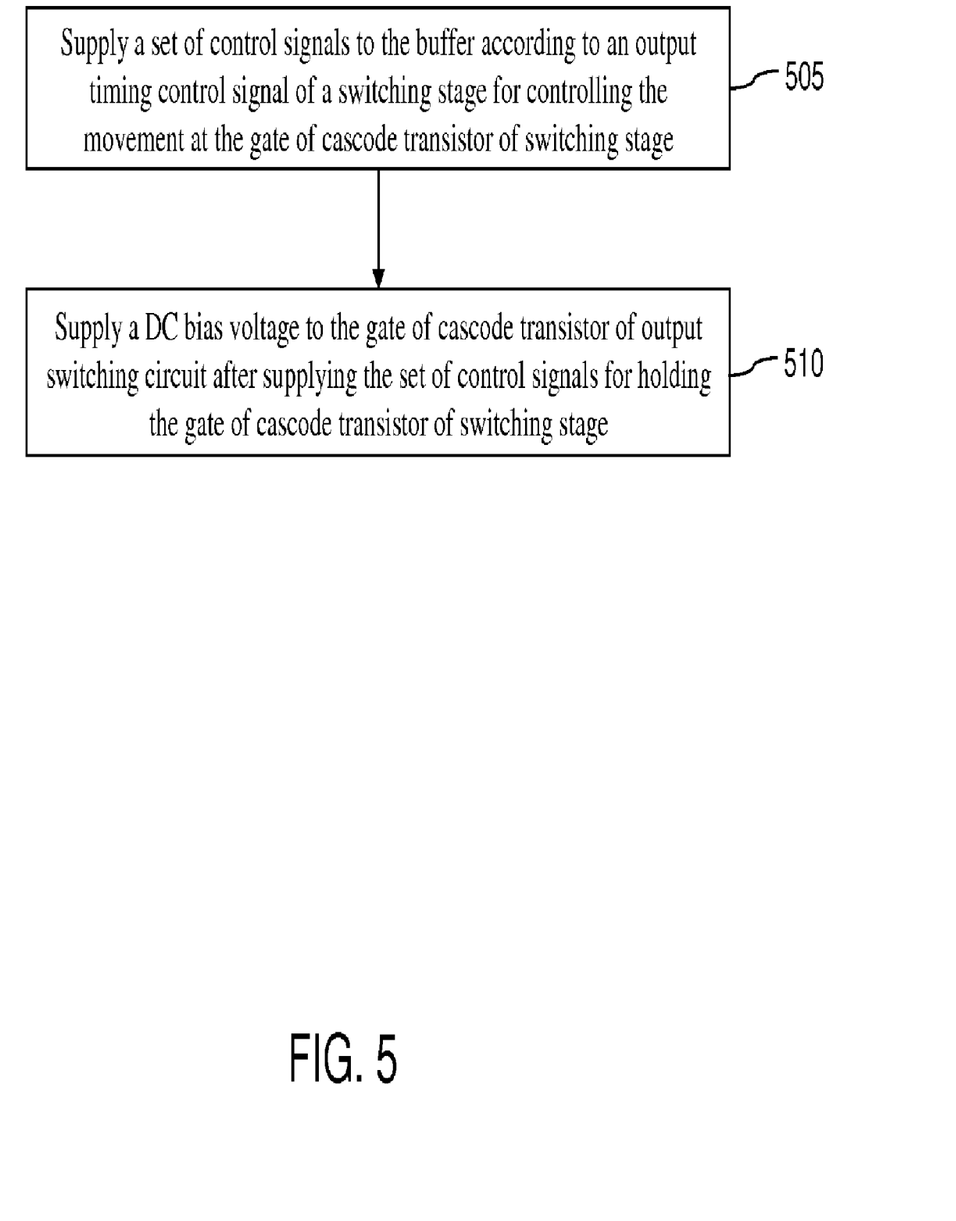
FIG. 5 is a flow diagram illustrating a method for controlling drive strength of the buffer according to an embodiment of the invention.

FIG. 5 is a flow diagram illustrating a method for controlling drive strength of a buffer according to an embodiment of the invention. At step 505, a set of control signals is supplied to the buffer according to an output timing control signal of a switching stage of the output switching circuit for controlling the movement at the gate of cascode transistor of switching stage. The set of control signals include a source signal and a sink signal (source signal 415 and sink signal 420 of FIG. 4). Source signal is supplied to the buffer when the output of the switching stage is transitioning to high, and a sink signal is supplied to the buffer when the output is transitioning to low. At step 510, after supplying source or sink signals, a predetermined DC bias voltage (Buffered CAS BIAS 425 of FIG. 4) is supplied to the gate of cascode transistor of the output switching circuit for holding the gate of cascode transistor of switching stage.

It will be appreciated that the method embodiment of the invention as illustrated in FIG. 5 is not limited to a buffer, and it can be further extended to any integrated circuit (active device) which controls switching transitions of an output switching circuit.

Figure 6:
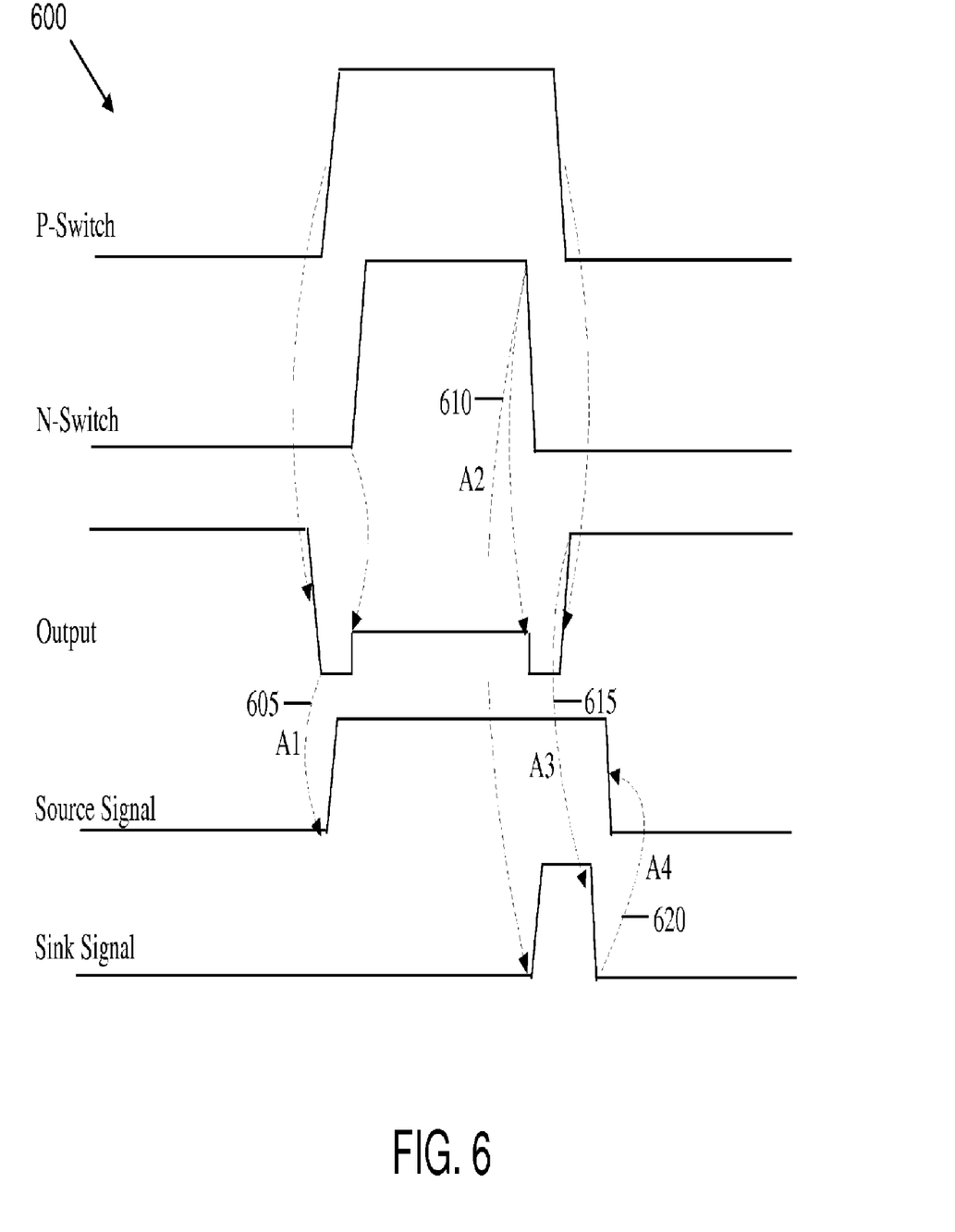
FIG. 6 is a timing diagram illustrating the working of the switch cascode architecture of FIG. 2 according to an embodiment of the invention.

FIG. 6 is a timing diagram 600 illustrating the working of the switch cascode architecture of FIG. 2 according to an embodiment of the invention. The timing diagram 600 includes the state changes of P-type switch, N-type switch, output of the switching stage, source signal and sink signal. A P-type switch is turning OFF when the state of the timing diagram is high and is turning ON when the state is low. An N-type switch is turning OFF when the state of the timing diagram is low and the switch is turning ON when the state is high. It is understood from the timing diagram 600 that N-type switch is turned ON only after P-type switch is turned OFF, and N-type switch is turned of OFF before P-type switch is turned on. These switches are independently controlled by the driver 250. When P-type switch is ON the output is high and when N-type switch is ON output is low. For a duration when none of the two switches are ON, a diode conducts the current as shown in the state changes of the output signal.

According to an embodiment of the invention, source or sink signals are supplied to the buffer according to the states of P-type switch and N-switch transistors of the output switching circuit. Source signal drives a P-type transistor 413 in the class AB buffer 400. Similarly, a sink signal drives an N-type transistor 421 in the class AB buffer 400. So, when the source signal is in a low state, P-type transistor 413 is ON, and when the sink signal is in a high state, N-type transistor 421 is ON. Sink signal is turned ON when N-type switch transistor 230 of the output switching circuit 200 is OFF which is denoted by the arrow 'A2', 610 in FIG. 6. Sink signal is withdrawn after the output of the switching stage is in the high state which is denoted the arrow 'A3', 615. Once the sink signal is withdrawn, the control is passed to the source signal which is denoted by the arrow 'A4', 620. Source signal is withdrawn when the output signal is in the low state which is denoted by the arrow 'A1', 605.

Figure 7:
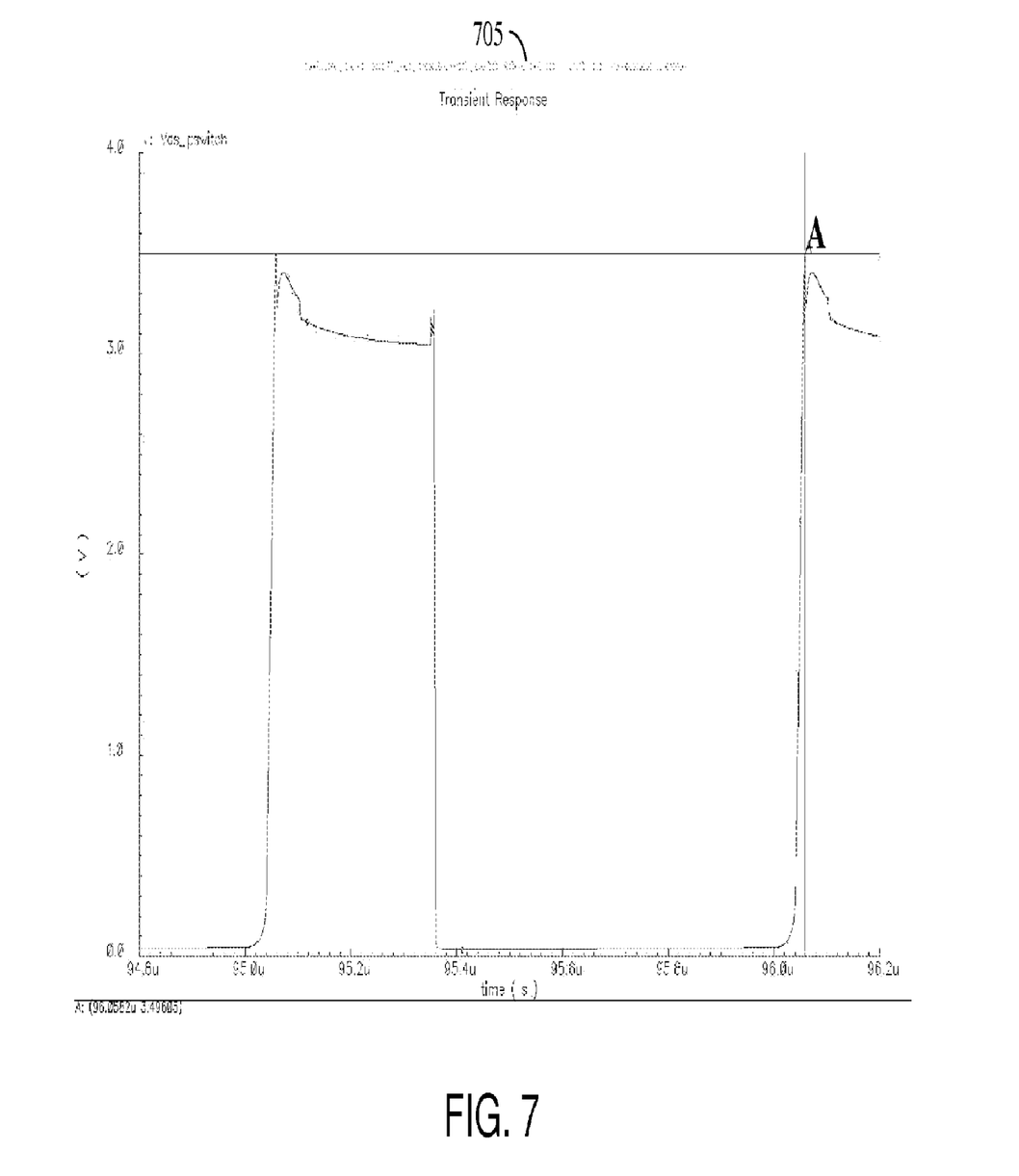
FIG. 7 and FIG. 8 are graphs illustrating transient response of the drain-source voltages (Vds) of the P-type switch transistor and P-type cascode transistor of cascode transistor stack according to an embodiment of the invention.
Figure 8:
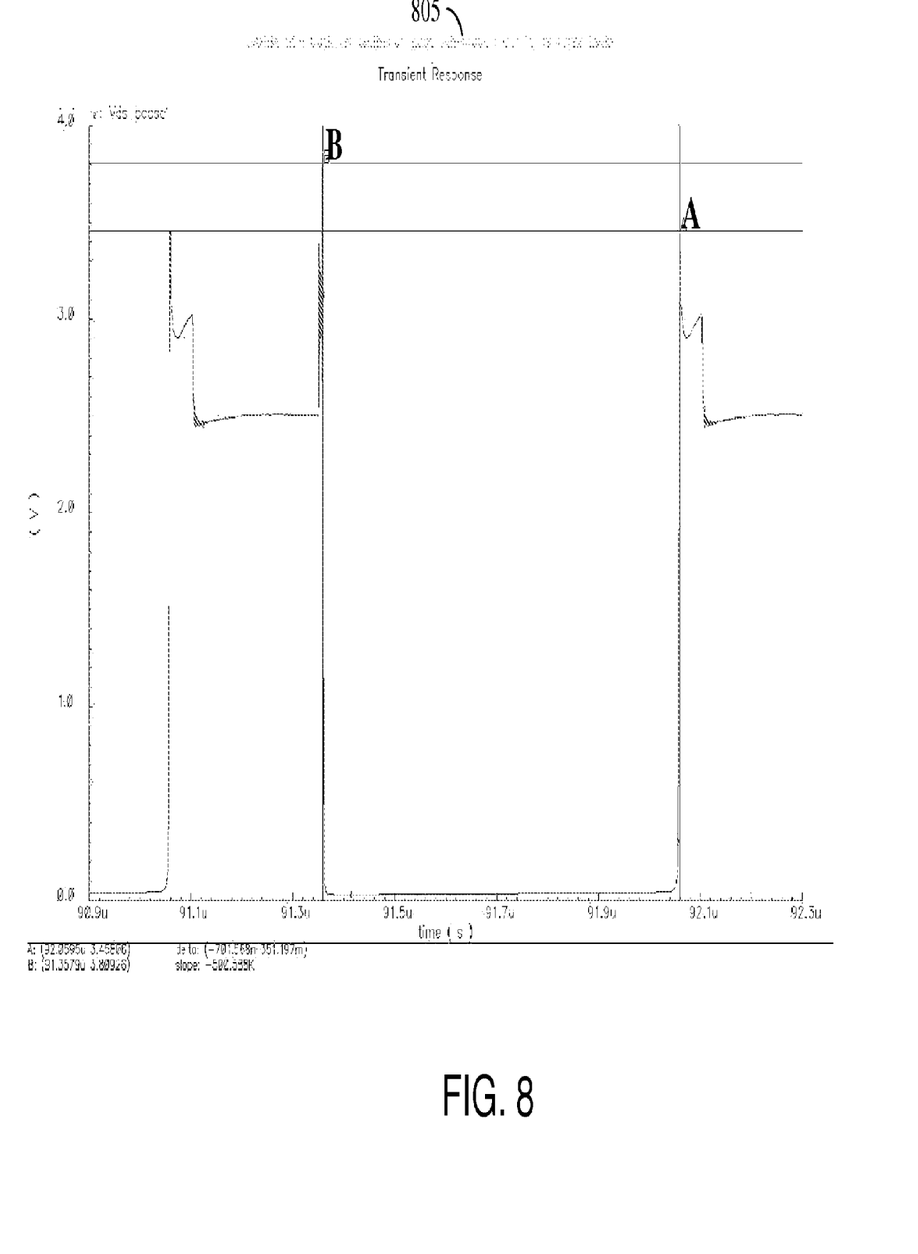

FIG. 7 and FIG. 8 are graphs illustrating transient response (of the drain-source voltage (Vds) of the P-type switch transistor 215 and P-type cascode transistor 220 of first cascode transistor stack 205 of the switching stage according to an embodiment of the invention. The maximum stress during switching transitions of the switching stage occurs between the drain and source (Vds) of the P-switch transistor 215 and P-type cascode transistor 220 of the cascode transistor stacks. Embodiments of the invention reduce the Vds stress such that the Vds of the P-type switch transistor 215 and P-type cascode transistor 220 is less than the tolerance limit. In FIG. 7, 705, point 'A' in the graph denotes the Vds of P-type switch transistor 215. The tolerance limit of the wave form used in the graph was 3.6V and it is clear from point 'A' that Vds is 3.49585V which is below the tolerance limit.

In FIG. 8, 805, point 'A' in the graph denotes Vds of the P-type cascode transistor 220 when the transistor is OFF and point 'B' in the graph denotes Vds when the transistor is ON. It is clear from point 'A' that in DC conditions Vds is 3.45806V which is below the tolerance limit, and only while transitions (point 'B') Vds is 3.80926V which is acceptable in the implementation.

In an embodiment of the invention, the term "connected" means at least either a direct electrical connection between the devices connected or an indirect connection through one or more passive or active intermediary devices. The term "circuit" means at least either a single component or a multiplicity of components, either active and/or passive, that are connected together to provide a desired function. The term "signal" means at least one current, voltage, charge, data, or other signal. Where either a Field Effect Transistor (FET) or a Bipolar Junction Transistor (BJT) may be employed as an embodiment of a transistor, the scope of the terms "gate", "drain", and "source" include "base", "collector", and "emitter", respectively, and vice versa.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A switching regulator comprising:
   a switching stage comprising a cascode transistor, the switching stage responsive to an external driver signal for switching transitions; and
   a bias generator operative to bias the cascode transistor to protect the switching stage from damage during the switching transitions, the bias generator comprising:
      a first circuit for supplying a cascode bias voltage to the cascode transistor by controlling a drive strength of the bias generator in response to a first control signal; and
      a second circuit for supplying a DC bias voltage to the cascode transistor in response to a bias voltage supplied, according to a predetermined criterion, to the second circuit after supplying the cascode bias voltage;
   wherein the bias generator has the drive strength which is controlled in response to switching transitions of the switching stage.

2. The switching regulator of claim 1, wherein the switching stage comprises:
   a set of cascode transistor stacks serially connected to each other, each of the cascode transistor stacks comprising a switch transistor and the cascode transistor serially connected to each other.

3. The switching regulator of claim 2, wherein the switch transistor and the cascode transistor are cascaded.

4. The switching regulator of claim 2, wherein at least one of the switch transistor and the cascode transistor is cascaded.

5. The switching regulator of claim 1, wherein the bias generator drives the cascode transistor such that a gate of the cascode transistor of the switching stage during switching transitions is controlled by controlling the drive strength of the bias generator in response to a first control signal of the switching stage.

6. The switching regulator of claim 1, wherein the cascode bias voltage is changed in proportion of the output voltage change to ensure that voltage stresses during the switching transition is divided equally between the switch transistor and the cascode transistor.

7. The switching regulator of claim 1, wherein the first circuit comprises:
   a second control signal supplied to the first circuit for supplying the cascode bias voltage in response to the first control signal.

8. The switching regulator of claim 7, wherein the second control signal comprises a sink signal supplied to the bias generator according to the output timing control signal when the output of the switching stage is transitioning to high.

9. The switching regulator of claim 8, wherein the DC bias voltage is supplied to the switching regulator for holding the gate of the cascode transistor of the switching stage to a value supplied DC bias voltage after supplying the sink signal.

10. The switching regulator of claim 7, wherein the second control signal comprises a source signal supplied to the bias generator according to the output timing control signal when the output of the switching stage is transitioning to low.

11. The switching regulator of claim 10, wherein the DC bias voltage is supplied to the switching stage for holding the gate of the cascode transistor of the switching stage to a value supplied DC bias voltage after supplying the source signal.

12. The switching regulator of claim 1, wherein the first control signal comprises an output timing control signal from the output of the switching stage.

13. The switching regulator of claim 1, wherein the bias generator is controlled using at least one of the output timing control signal and the external driver signal.

14. A drive circuit for controlling drive strength of a bias generator connected to an output switching circuit, the drive circuit comprising:
   a first circuit for controlling the drive strength of the bias generator in response to a control signal supplied to the bias generator according to an output timing control signal of a switching stage of the output switching circuit; and
   a second circuit for supplying a DC bias voltage to an output switching circuit in response to a bias voltage supplied to the second circuit according to a predetermined criterion after supplying the control signal.

15. The drive circuit of claim 14, wherein said first circuit comprises:
   a first transistor stack comprising a series connected structure of a first transistor, a second transistor, a third transistor and a fourth transistor, gates of the second transistor and the third transistor supplied with the bias voltage according to the predetermined criterion.

16. The drive circuit of claim 14, wherein said second circuit comprises:
   a second transistor stack for supplying a cascode bias voltage to the output switching circuit, the second transistor stack comprising a series connected structure of a fifth transistor, a sixth transistor, a seventh transistor and an eighth transistor, gates of the fifth transistor and eighth transistor being supplied with the control signal for controlling the drive strength of the bias generator, gates of the second transistor and the sixth transistor connected to each other and the gates of the third transistor and seventh transistor connected to each other.

17. The drive circuit of claim 14, wherein the control signal comprises:
   a sink signal supplied to the bias generator according to the output timing control signal when the output of the output switching circuit is transitioning to high; and
   a source signal supplied to the bias generator according to the output timing control signal when the output of the output switching circuit is transitioning to low.

18. The drive circuit of claim 14, wherein the drive strength of the bias generator is actively controlled by supplying a high source signal or sink signal prior to activating the at least one switch transistor of the output switching circuit and by supplying a low source signal or sink signal when the at least one switch transistor is inactive whereby power consumption of the bias generator is reduced.

19. A method for protecting a switching stage of a switching regulator from damage during switching transitions, the method comprising:
   controlling a drive strength of a bias generator responsive to switching transitions of the switching stage, wherein controlling the drive strength of the bias generator comprises:
      toggling an output node of the switching stage using an external driver signal;
      supplying a first control signal to the bias generator responsive to switching transitions, the first control signal including an output timing control signal from the switching regulator; and
      supplying a second control signal to the bias generator responsive to the first control signal; and
   biasing a cascode element of the switching stage using the bias generator.

20. The method of claim 19, wherein supplying a second control signal comprises:
    supplying a sink signal to the bias generator according to the output timing control signal when the output of the switching regulator is transitioning to high;
    supplying a source signal to the bias generator according to the output timing control signal when the output of the switching regulator is transitioning to low; and
    holding the value of the output to a value according to the bias voltage supplied to the bias generator according to a predetermined criterion, after supplying the sink signal or source signal.

21. The method of claim 20, wherein supplying the sink signal and supplying the source signal comprises:
    controlling the bias generator actively by supplying a high current sink signal and source signal prior to activating the at least one switch transistor; and
    controlling the bias generator actively by supplying a low current sink signal and source signal when the at least one switch transistor is inactive whereby power consumption of the bias generator is reduced.

* * * * *